United States Patent [19]

Masujima et al.

[11] Patent Number: 5,089,314

[45] Date of Patent: Feb. 18, 1992

[54] CARRIER TAPE FOR ELECTRONIC CIRCUIT ELEMENTS AND METHOD OF MANUFACTURING AN ELECTRONIC CIRCUIT ELEMENT SERIES

[75] Inventors: Sho Masujima; Hiroshi Yagi; Atsuzo Tamashima; Masakazu Kamoshida, all of Tokyo, Japan

[73] Assignee: TDK Corporation, Tokyo, Japan

[21] Appl. No.: 481,756

[22] Filed: Feb. 15, 1990

Related U.S. Application Data

[63] Continuation of Ser. No. 154,804, Feb. 11, 1988, abandoned.

[30] Foreign Application Priority Data

| Feb. 25, 1987 | [JP] | Japan | 62-26656[U] |
|---|---|---|---|
| Feb. 25, 1987 | [JP] | Japan | 62-26657[U] |
| Feb. 25, 1987 | [JP] | Japan | 62-26658[U] |
| Feb. 25, 1987 | [JP] | Japan | 62-26659[U] |
| Mar. 25, 1987 | [JP] | Japan | 62-43695[U] |
| Mar. 25, 1987 | [JP] | Japan | 62-43696[U] |
| Jul. 14, 1987 | [JP] | Japan | 62-176329 |

[51] Int. Cl.$^5$ .................................. B32B 9/00
[52] U.S. Cl. .................................. 428/156; 428/198; 428/209; 428/901; 428/908; 206/328; 206/330; 206/332
[58] Field of Search .............. 428/198, 209, 156, 901, 428/908; 206/328, 330, 332

[56] References Cited

U.S. PATENT DOCUMENTS

| 3,655,496 | 4/1972 | Ettre et al. | 206/330 |
|---|---|---|---|
| 3,858,721 | 1/1975 | Boyer et al. | 206/330 |
| 4,069,916 | 1/1978 | Fowler et al. | 206/330 |
| 4,092,626 | 5/1978 | Bergersen | 206/330 |
| 4,568,602 | 2/1986 | Stow | 428/172 |
| 4,600,116 | 7/1986 | Inano et al. | 206/330 |
| 4,657,137 | 4/1987 | Johnson | 206/329 |
| 4,702,788 | 10/1987 | Okui | 156/252 |
| 4,708,245 | 11/1987 | Boeckmann et al. | 206/330 |
| 4,961,984 | 10/1990 | Takeda | 206/328 |

FOREIGN PATENT DOCUMENTS

| 2004669 | 1/1990 | Japan . |
|---|---|---|
| 2170469 | 8/1986 | United Kingdom . |

*Primary Examiner*—Patrick J. Ryan
*Attorney, Agent, or Firm*—Helfgott & Karas

[57] ABSTRACT

A carrier tape for electronic circuit elements adapted to be provisionally held on printed circuit boards prior to fixing of them on said printed circuit boards by soldering, comprises a flexible tape body extending in a longitudinal direction, and adhesive means applied with respect to the tape body and for serving the purpose of provisionally holding of electronic circuit elements on printed circuit boards, the adhesive means being formed of a material which exhibits adhesion upon being heated. The adhesive means is formed of a polymeric material which exhibits adhesion upon being heated. The carrier tape further includes electronic circuit elements held with respect to the tape body at equal intervals in a row in the longitudinal direction of the tape body through the adhesive means, thereby constituting an electronic circuit element series. When respective electronic circuit elements are removed from the electronic circuit element series, the adhesive means sticking to the respective electronic circuit elements are adapted to be also removed from the series. The adhesive means sticking to the respective electronic circuit elements are then heated, through which adhesive means have exhibited adhesion due to heating the respective electronic circuit elements are provisionally held on a printed circuit board. Also, a method of manufacturing an electronic circuit element series is disclosed.

25 Claims, 11 Drawing Sheets

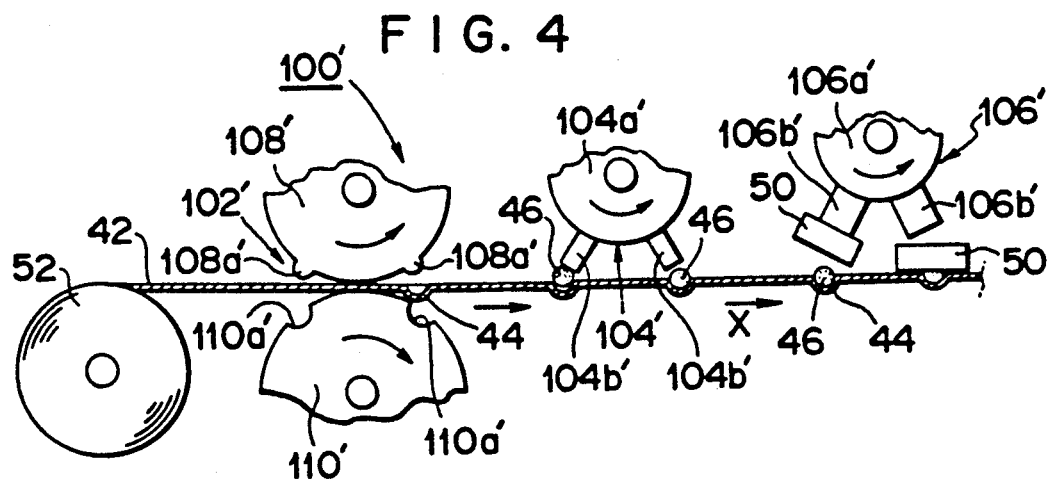
FIG. 4
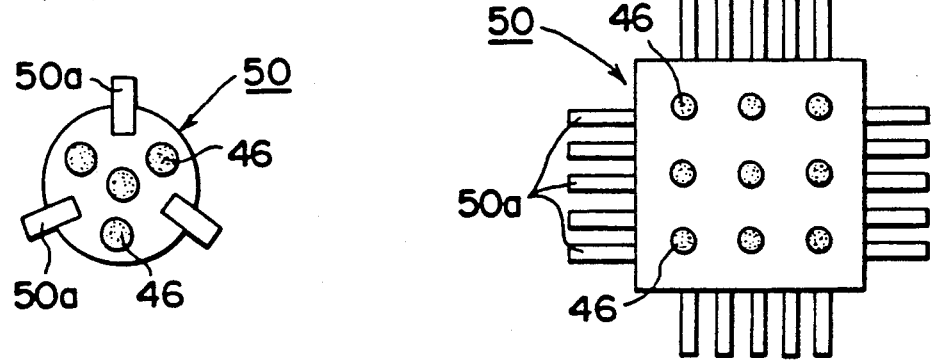
FIG. 5
FIG. 6
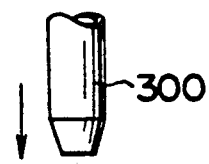
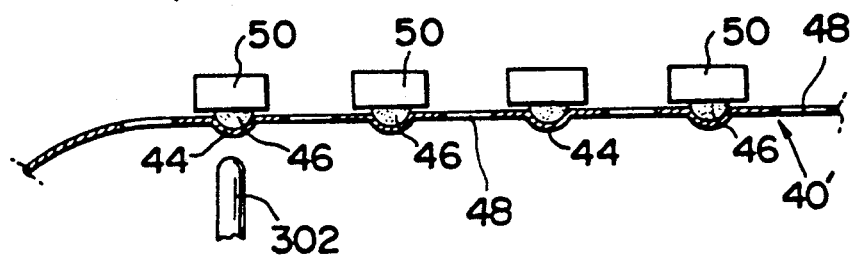
FIG. 7A

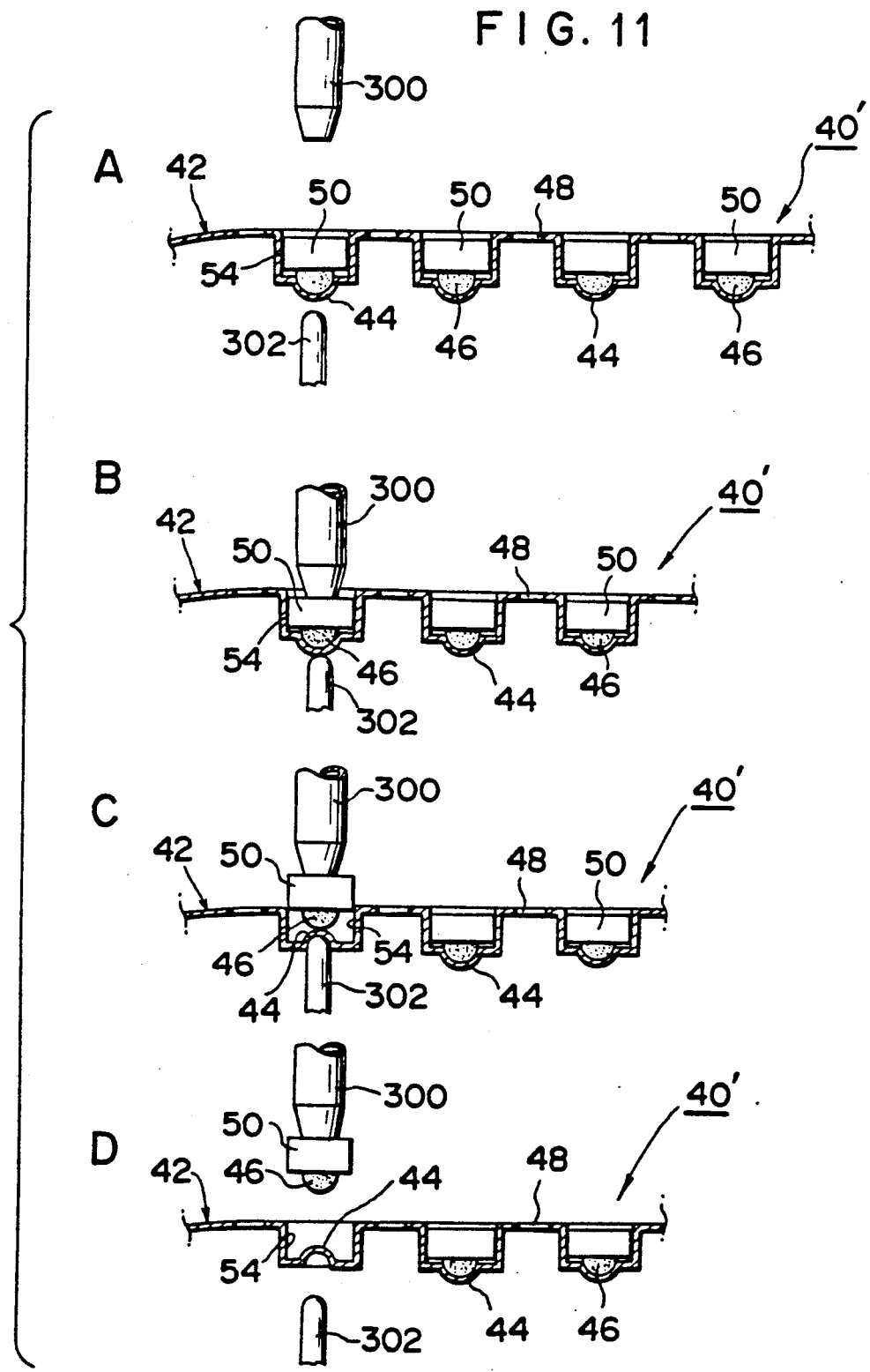

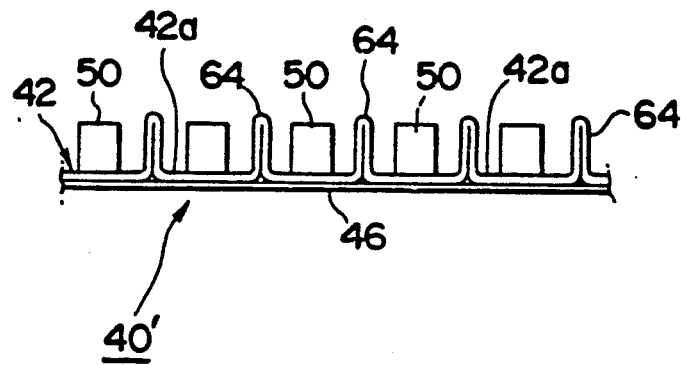
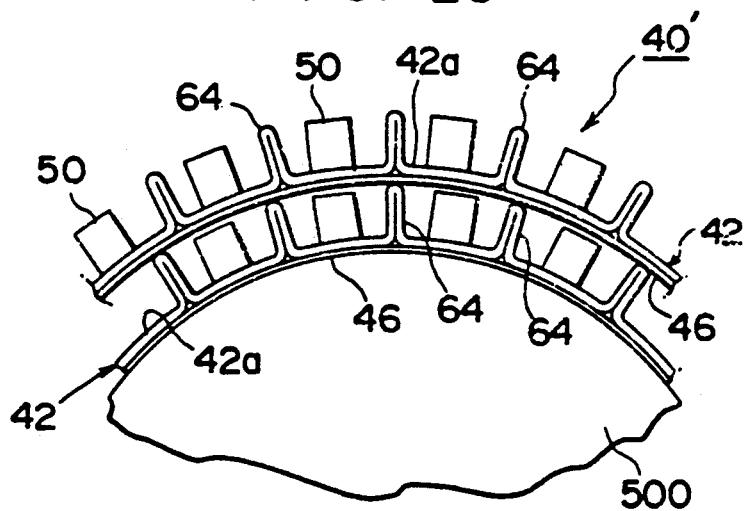
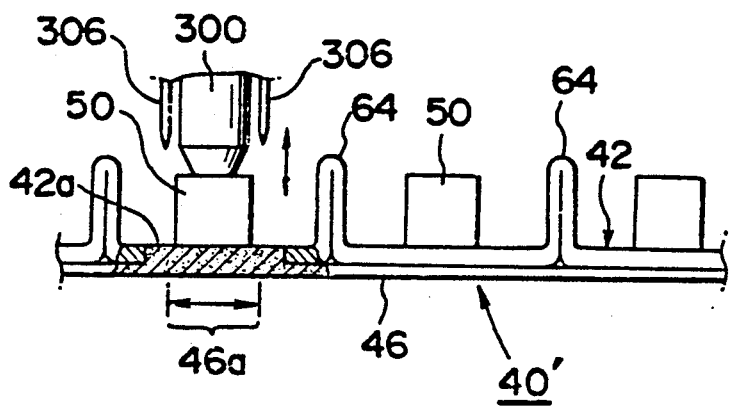

CARRIER TAPE FOR ELECTRONIC CIRCUIT ELEMENTS AND METHOD OF MANUFACTURING AN ELECTRONIC CIRCUIT ELEMENT SERIES

This is a continuation of application Ser. No. 154,804, filed Feb. 11, 1988, now abandoned.

BACKGROUND OF THE INVENTION

1. Field of the Invention

This invention relates to an electronic circuit element series mounted on a carrier tape, and more particularly to a carrier tape for electronic circuit elements which are adapted to be mounted on printed circuit boards by soldering while being provisionally held on the printed circuit Boards by means of adhesive means.

2. Description of the Prior Art

Generally, mounting of surface-mounted electronic circuit elements on a printed circuit board by soldering is carried out in such a manner that first a predetermined number of electronic circuit elements are provisionally held at predetermined positions on the printed circuit board and then stably fixed together on the printed circuit board by soldering. The provisional or temporary holding of the electronic circuit elements on the printed circuit board which is carried out prior to soldering operation is generally performed by adhesives.

An example of an electronic circuit element series having electronic circuit elements which are adapted to be provisionally held on printed circuit boards through adhesive prior to a soldering operation is found, for example, in Japanese Utility Model Publication No. 11438/1981 (in the name of TDK Corporation). The electronic circuit element series comprises a flat tape extending in a longitudinal direction and having a thermosetting adhesive applied onto one surface thereof, and a plurality of electronic circuit elements held on the surface of the tape through the adhesive. Each of the electronic circuit elements held on the tape, when it is to be mounted on a printed circuit board by, for example, a mounting head of an electronic circuit element mounting apparatus, is adapted to be removed from the tape by means of the mounting head to be provisionally held on the printed circuit board through the adhesive. However, with the conventional electronic circuit element series having the thermosetting adhesive, the thermosetting adhesive is applied onto one surface of the flat tape, so that there is a possibility that dirt and/or dust may directly stick to the adhesive. Also, it is hard to release or extract the electronic circuit elements from the tape by the mounting head because the adhesive adheres to the entire bottom surfaces of the electronic circuit elements to hold them on the tape to a degree sufficient to prevent the smooth peeling-off. Even when an electronic circuit element is released from the tape, it pulls the tape through the adhesive during the peeling-off operation. This results in the tape acting on electronic circuit elements adjacent to the released one when it elastically returns to the original position, thereby causing them to be separated from the tape. Furthermore, there is a possibility that the adhesive may remain on the tape and fail in sticking to an electronic circuit element when the electronic circuit element is peeled off from the tape, so that the electronic circuit element would not be stably provisionally held on the printed circuit board when it is placed on the printed circuit board by the mounting head.

Generally, the electronic circuit element series of the type described above is spirally wound around, for example, a reel for storage and transportation thereof. It is therefore necessary to prevent the electronic circuit elements from being damaged by external force and coming off from the tape when the electronic circuit element series is wound around the reel.

SUMMARY OF THE INVENTION

The present invention has been suggested to overcome the foregoing disadvantages of the prior art.

It is therefore an object of the present invention to provide a carrier tape for electronic circuit elements adapted to be provisionally held on printed circuit boards prior to a soldering operation, which comprises a tape body and adhesive means applied to the tape body for use in provisional fixing of electronic circuit elements on printed circuit boards, the adhesive means being formed of a material which does not exhibit any adhesion at a normal temperature and exhibits adhesion when it is heated.

It is another object of this invention to provide a carrier tape of the type described, capable of preventing dirt and/or dust from sticking to the adhesive means.

It is still another object of this invention to provide a carrier tape of the type described, which further comprises a plurality of surface-mounted electronic circuit elements held on the tape body by means of the adhesive means so as to constitute an electronic circuit element series.

It is yet another object of this invention to provide an electronic circuit element series of the type described, capable of preventing dirt and/or dust from sticking to the adhesive means.

It is still a further object of this invention to provide an electronic circuit element series of the type described, capable of facilitating extracting or releasing of the electronic circuit elements from the tape body substantially free of any trouble.

It is still a further object of this invention to provide an electronic circuit element series of the type described, with which it is possible to positively and efficiently accomplish provisional fixing of the electronic circuit elements on printed circuit boards.

It is still a further object of this invention to provide an electronic circuit element series of the type described, capable of protecting the electronic circuit elements from external force and preventing them from coming off from the tape when the electronic circuit element series is spirally wound around, for example, a reel for storage and transportation thereof.

BRIEF DESCRIPTION OF THE DRAWINGS

For a fuller understanding of this invention, reference is made to the following description taken in connection with the accompanying drawings in which like reference numerals indicate like or corresponding parts throughout, wherein:

FIG. 4 is a schematic view of another example of an apparatus for carrying out a method of manufacturing an electronic circuit element series;

FIGS. 5 and 6 are bottom views showing examples of an electronic circuit element which may be employed in the electronic circuit element series shown in FIG. 2, and showing the examples when they are removed from the tape body of the electronic circuit element series;

FIGS. 7A to 7D are schematic views for explaining the manner of removing of an electronic circuit element from the tape body of the electronic circuit element series shown in FIG. 2;

FIGS. 11A to 11D are vertical sectional views for explaining the manner of removing of an electronic circuit element from the tape body of the electronic circuit element series shown in FIG. 9C;

FIGS. 22A and 22B are a segmentary plan view showing still another modification of the electronic circuit element series shown in FIG. 12, and a segmentary side elevation view showing the modification of FIG. 22A, respectively;

FIG. 23 is a segmentary side elevation view of assistance in explaining a state of the electronic circuit element series of FIG. 22 being wound around a reel; and FIG. 24 is a partially cutaway side elevation view for explaining the manner of removing of an electronic circuit element from the tape body of the electronic circuit element series of FIG. 22.

DETAILED DESCRIPTION OF THE PREFERRED EMBODIMENTS

A carrier tape for surface-mounted electronic circuit elements according to the present invention generally includes a tape body extending in a longitudinal direction, and adhesive means applied to the tape body for provisional fixing of surface-mounted electronic circuit elements on printed circuit boards. The adhesive means is formed of a material which does not exhibit any adhesion at a normal temperature and exhibits adhesion when it is heated. For example, it may be formed of a polymeric material selected from the group consisting of silicone, acrylic resin and the mixture of silicone with acrylic resin, which exhibits adhesion by heating.

Figure 1A:
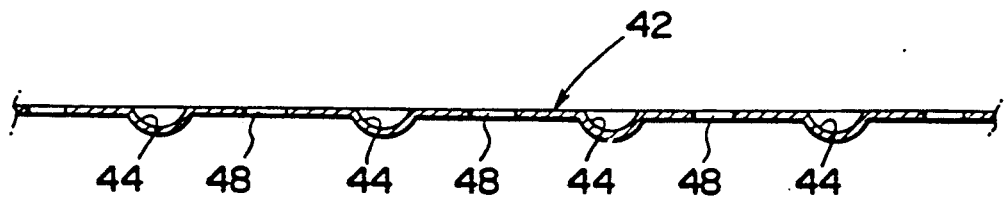
FIG. 1A is a segmentary vertical sectional view of a tape body employed in a carrier tape according to a first embodiment of this invention.
Figure 1B:
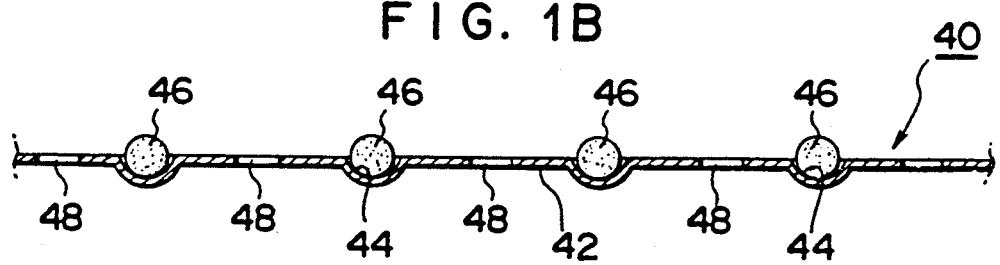
FIG. 1B is a segmentary vertical sectional view of the carrier tape according to the first embodiment of this invention.
Figure 2:
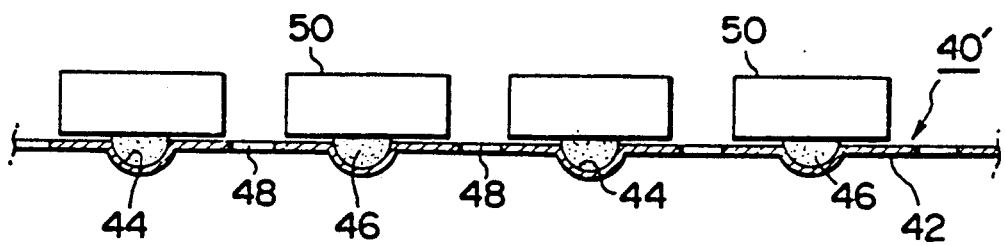
FIG. 2 is a segmentary vertical sectional view of the carrier tape according to the first embodiment of this invention, wherein the carrier tape comprises a plurality of electronic circuit elements held on the tape body, thereby constituting an electronic circuit element series.

Referring now to FIGS. 1 and 2, a carrier tape 40 for surface-mounted electronic circuit elements according to a first embodiment of the present invention comprises a flexible tape body 42 which is made of soft resin material such as polypropylene or the like, extends in a longitudinal direction and provided with a plurality of relatively small-size recesses 44 of substantially hemispherical shapes spaced at equal intervals from one another in the longitudinal direction of the tape body 42; and adhesive means 46 for provisional fixing of electronic circuit elements to be mounted on the surfaces of printed circuit boards. The adhesive means 46 is formed of a polymeric material selected from the group consisting of silicone, acrylic resin and the mixture of silicone with acrylic resin, which exhibits adhesion upon being heated to a temperature as low as about 80° C., and is received in each of the recesses 44 of the tape body 42. Also, the carrier tape body 42 may be formed with a plurality of feeding perforations 48 provided at equal intervals in the longitudinal direction thereof. The feeding perforations 48 are used in order to feed the electronic circuit elements, which are to be held on the carrier tape body 42, to a mounting head of an apparatus for mounting electronic circuit elements on a printed circuit board as described later. In FIG. 2, the tape body 42 includes a plurality of electronic circuit elements 50 such as capacitors or the like held thereon in a row in the longitudinal direction of the carrier tape body 42, thereby constituting an electronic circuit element series 40'. More particularly, each of electronic circuit elements 50 is held on the carrier tape body 42 through the adhesive means 46 received in each recess 44 of the carrier tape body 42. Firm holding of electronic circuit elements 50 on the carrier tape body 42 may be carried out by heating the adhesive means 46 received in the respective recesses 44 and then placing the electronic circuit elements on respective ones of the heated adhesive means 46. Incidentally, each of the recesses 44 is made smaller than the bottom surface area of each electronic circuit element 50.

Figure 3:
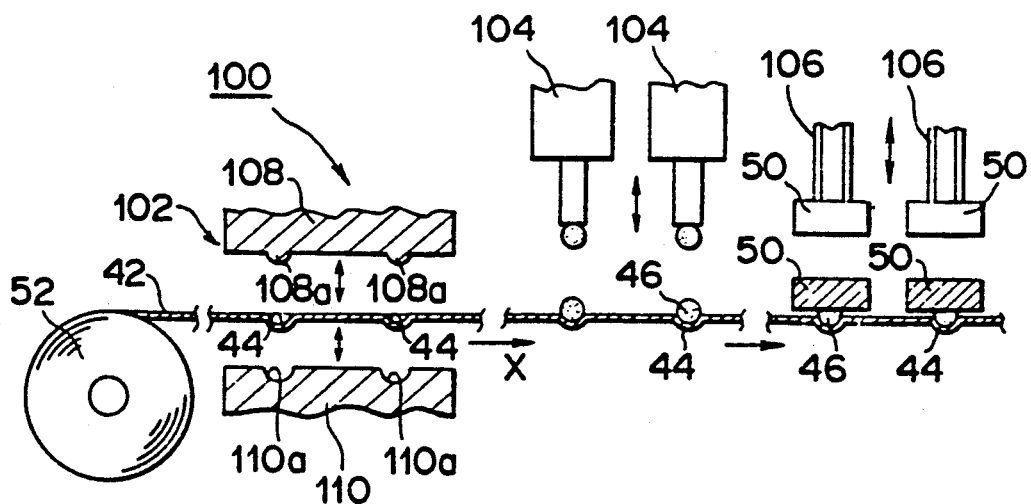
FIG. 3 is a schematic view of an example of an apparatus used for performing a method of manufacturing an electronic circuit element series.

Referring to FIG. 3, description will be made of a method of manufacturing the electronic circuit element series 40' showing in FIG. 2. In the manufacturing method, forming of recesses 44 in the carrier tape body or sheet 42 and placing electronic circuit elements 50 on the carrier tape body sheet 42 may be successively carried out as described later. In FIG. 3, reference numeral 52 designates a roll for carrier tape body sheet 42 made of flexible material, from which the carrier tape body sheet 42 is drawn out by any suitable feeding means (not shown) to be intermittently fed to an apparatus 100 for manufacturing an electronic circuit element series 40'. The manufacturing apparatus 100 comprises electronic die means 102 for embossing predetermined portions of a carrier tape body sheet 42 to form recesses 44 of substantially hemispherical shapes at the predetermined portions of the carrier tape body sheet 42; means 104 for filling heated adhesive means 46 into the respective recesses 44 formed by the die means; and means 106 for placing electronic circuit elements 50 on the carrier tape body sheet 42 to cause the electronic circuit elements 50 to be held on the carrier tape body sheet 42 through the adhesive means 46. The means 102, 104 and 106 are arranged in order along a forward direction X of the carrier tape body sheet 42. Each of the means 102, 104 and 106 is adapted to be actuated synchronously with the intermittent movement of the carrier tape body sheet 42. In the example being illustrated, the die means 102 comprises a pair of upper and lower plates 108, 110 which are vertically arranged opposite to each other and are adapted to be vertically moved. The upper plate 108 is provided with two projections 108a of substantially hemispherical shapes, rigidly secured onto the under surface thereof and arranged along the longitudinal direction of the upper plate 108, while the lower plate 110 is provided with two recesses 110a of substantially hemispherical shapes at portions of its upper surface, which are positionally aligned with the portions of the under surface of the upper plate 108 at which the two projections 108a are located. The dimensions of the projections 108a are smaller than the dimensions of the recesses 110a, so that the projections 108a are adapted to be engaged through the sheet 42 with the recesses 110a as described later when the die means 102 is actuated. The electrical connections to the die means 102 are conventional and well-known, and have been omitted for the purpose of simplification. Normally, the upper and lower plates 108, 110 are in an upward position and in a downward position, respectively. When the sheet 42 is drawn out from the roll 52 to be fed into the space between the upper and lower plates 108, 110 and the forward movement of the sheet 42 is stopped, the upper plate 108 and the lower plate 110 are synchronously moved downwardly and upwardly, respectively, with respect to the sheet 42 fed into the space between the upper plate 108 and the lower plate 110 to press the sheet 42 therethrough. At this time, the projections 108a of the upper plate 108 are respectively engaged with the recesses 110a of the lower plate 110 through the sheet 42 and electric current is applied to the die means 102, resulting in two recesses 44 being formed in the sheet 42 by cooperation of the projections 108a of the upper plate 108 and the recesses 110a of the lower plate 110. Then, the upper plate 108 and the lower plate 110 are moved to their original positions so that the sheet 42 may be moved forwardly again. The adhesive filling means 104 arranged in advance of the die means 102 are adapted to be vertically moved and are normally in upward positions. When the sheet 42 is moved forwardly to cause the recess portions 44 of the sheet 42 to reach positions right below the adhesive filling means 104, the latter are moved downwardly with respect to the sheet 42 to fill adhesive means 46 softened by heating into the recesses 44 of the sheet 42. Then, the adhesive filling means 104 are moved to their original positions. The electronic circuit element placing means 106 arranged in advance of the filling means 104 are also adapted to be vertically moved and are normally in upward positions. When the sheet 42 is further moved forwardly to cause the recess portions 44 filled with the adhesive means 46 to reach positions right below the means 106, each of the means 106 is moved downwardly with respect to the sheet 42 to place an electronic circuit element 50 on the sheet 42 in a manner to cause it to come into contact with the adhesive means 46 filled in recess 44, resulting in the electronic circuit element 50 being held on the sheet 42 through the adhesive means 46 which has exhibited adhesion due to heating. The above-described procedure is substantially repeated to manufacture an electronic circuit element series 40' shown in FIG. 2.

In place of the manufacturing apparatus shown in FIG. 3, a manufacturing apparatus 100' as shown in FIG. 4 may be employed. In the manufacturing apparatus 100', recess forming means 102' comprises a pair of upper and lower rolls 108', 110' which are vertically arranged opposite to each other. The upper roll 108' is provided with a plurality of projections 108a' of substantially hemispherical shapes on a periphery of its body, while the lower roll 110' has a plurality of recesses 110a' formed into substantially hemispherical shapes in a periphery of its body. The projections 108a' of the upper roll 108' and the recesses 110a' of the lower roll 110' are adapted to be engaged with each other through the sheet 42 in relation to rotation of the upper and lower roll 108', 110', thereby forming recesses 44 in the sheet 42. Arranged in advance of the upper roll 108' of the forming means 102', is means 104' for filling adhesive means 46 softened by heating into the recesses 44 which are formed in the sheet 42 by the forming means 102'. The filling means 104' includes a roll body 104a' and a plurality of adhesive means filling heads 104b' provided at a periphery of the roll body 104a'. The roll body 104a' is adapted to rotate to cause the filling heads 104b' to fill adhesive means 46 into the recesses 44 which are formed in the sheet 42 by means of the forming means 102'. Arranged in advance of the filling means 104' is means 106' for placing electronic circuit elements on the sheet 42. The placing means 106' includes a roll body 106a' and a plurality of suction pins 106b' provided at a periphery of the roll body 106a'. The roll body 106a' is adapted to rotate to cause the suction pins 106b' to place electronic circuit elements 50 on the sheet 42.

Incidentally, some surface-mounted electronic circuit elements have three leads 50a as shown in FIG. 5 or have leads 50a like crab legs as shown in FIG. 6. In order to facilitate a provisional fixing of such relatively large-size electronic circuit elements 50 on a printed circuit board, it is to be desired that the electronic circuit elements 50 each should be adhered, at a plurality of points on their bottom surfaces, to the printed circuit board with adhesive means 46. For this purpose, a plurality of relatively small-size recesses may be formed by die means at a portion of the sheet 42 on which each of the electronic circuit elements 50 is to be held, in which recesses heated adhesive, means 46 are filled. Then, the electronic circuit elements 50 are each held on the tape body sheet 42 through the adhesive means by placing the electronic circuit element on the cluster of the recesses filled with the adhesive means 46.

Generally speaking, in order to facilitate successive feeding of electronic circuit elements to a mounting head of an automatic mounting apparatus, and transportation and storage of the electronic circuit element series, the electronic circuit element series 40' manufactured in the manner described above is adapted to be spirally wound around a reel (not shown). The reel having the electronic circuit element series 40' spirally wound therearound, when it is used, is installed in an apparatus (not shown) for mounting electronic circuit elements on printed circuit boards. In the mounting apparatus, any suitable feeding means, e.g., teeth of a feed wheel are engaged with the feeding perforations 48 (FIG. 2) of the tape body 42 to cause the electronic circuit element series 40' to be drawn out from the reel, whereby the electronic circuit element series 40' is moved forwardly. When the electronic circuit element series 40' is drawn out from the reel in the above described manner to be moved to a position below a mounting head of the mounting apparatus, the mounting head is moved downwardly with respect to the electronic circuit element series 40' to hold, via suction, one of the electronic circuit elements 50 held on the carrier tape body 42. Then, the mounting head is moved upwardly to remove or extract the electronic circuit element 50 from the electronic circuit element series 40'.

Figure 7B:
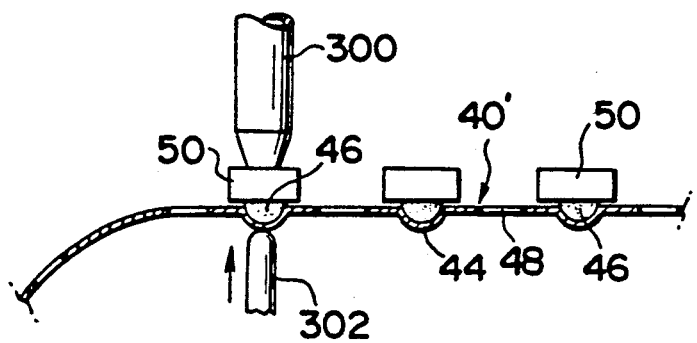
Figure 7C:
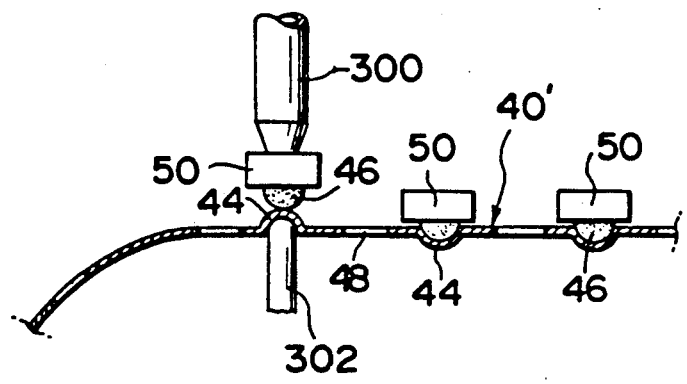
Figure 7D:
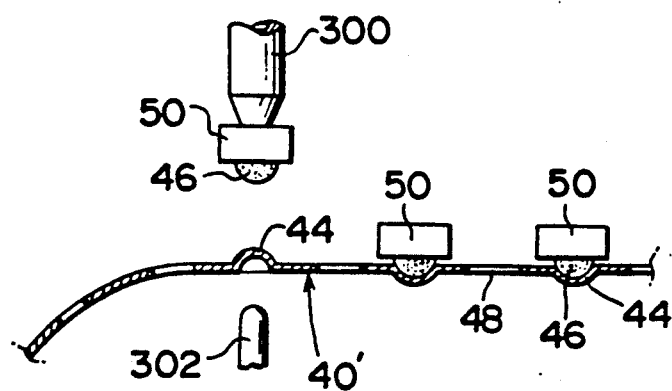
Figure 8:
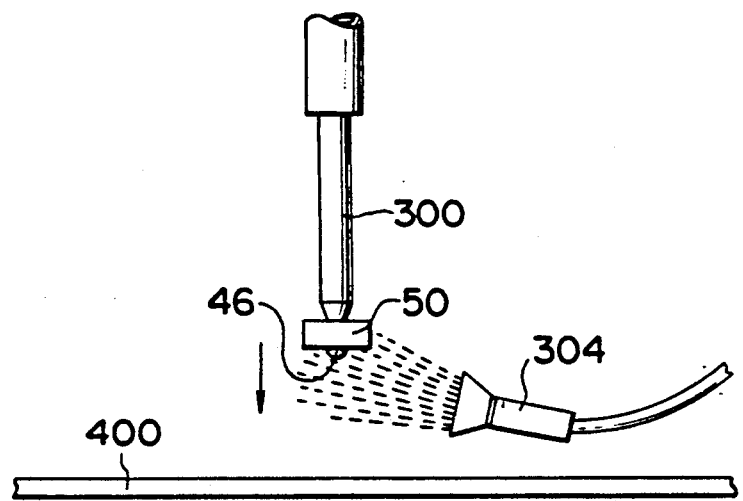
FIG. 8 is a schematic view for explaining the manner of heating of adhesive means sticking to the electronic circuit element which has been removed from the tape body of the electronic circuit element series.

Referring now to FIGS. 7A-7D, the manner of removing or extracting of an electronic circuit element 50 from the electronic circuit element series 40' will be described more in detail. In FIGS. 7A-7D, a reference numeral 300 designates a mounting head which is adapted to be vertically moved and is connected to an air-absorbing source (not shown) for sucking electronic circuit elements one by one from the electronic circuit element series 40'. Arranged right below the mounting head 300 is an ejector pin 302 which is also adapted to be vertically moved. When the mounting head 300 holds, via suction, one of the electronic circuit elements 50 held on the carrier tape body 42 to move upwardly, synchronously with the upward movement of the mounting head 300 the ejector pin 302 is moved upwardly to push up the electronic circuit element 50 together with the adhesive means 46 sticking to the bottom surface of the electronic circuit element 50 through a recess portion 44 of the carrier tape body 42 on which the electronic circuit element is arranged. At this time, the recess portion 44 is reversed by the pushing up motion of the ejector pin 302 as shown in FIG. 7C, since the carrier tape body 42 is made of flexible material to be deformable as described above. Thus, the electronic circuit element 50 with the adhesive means 46 may be securely removed or extracted from the carrier tape body 42 by means of the mounting head 300 as shown in FIG. 7D. Then, the mounting head 300 having held the electronic circuit element 50 with the adhesive means 46 by suction is moved toward a printed circuit board 400 (FIG. 8) and then moved downwardly with respect to the printed circuit board 400 to place the electronic circuit element 50 on the printed circuit board. Before the mounting head 300 is moved downwardly to place the electronic circuit element 50 on the printed circuit board 400, the adhesive means 46, having adhered to the bottom surface of the electronic circuit element 50, is subjected to a heating treatment. The heating treatment may be carried out using hot air ejected from an injection nozzle 304 as shown in FIG. 8. The heating treatment may be carried out using air heated to a temperature of about 80° C., resulting in the adhesive means 46 exhibiting adhesion. Also, the heating treatment may be carried out by heat beam irradiating means, a heating oven or a heater. The mounting head 300 holding the electronic circuit element 50 by vacuum is then moved downwardly to cause the electronic circuit element 50 to come into contact with the printed circuit board 400 through the heated adhesive means 46, resulting in the electronic circuit element 50 being firmly provisionally held on the printed circuit board 400 through the adhesive means 46 having exhibited adhesion due to heating. In this connection, the provisional fixing of the electronic circuit element 50 on a printed circuit board may be carried out by preparing a printed circuit board having a hot-melt type solder or a cream solder previously applied to a conductive pattern which is formed on the printed circuit board and placing the electronic circuit element 50 on the printed circuit board in a manner such that external terminals of the electronic circuit element 50 come into contact with the solder.

The above-described procedure is substantially repeated to provisionally fix a predetermined number of electronic circuit elements on a printed circuit board to form a desired electronic circuit. Thereafter, the printed circuit board having the predetermined number of the electronic circuit elements provisionally fixed thereon, is passed through a heating oven, resulting in the electronic circuit elements provisionally held on the printed circuit board by the adhesive means 46 being firmly fixed through the external terminals thereof on the printed circuit board by soldering.

Thus, it will be noted that the carrier tape comprising the adhesive means for use in the provisional fixing of electronic circuit elements on printed circuit boards according to the first embodiment is capable of preventing dirt and/or dust from sticking to the adhesive means, because the adhesive means is formed of a material which does not exhibit adhesion at a normal temperature. Especially, in the carrier tape constituting the electronic circuit element series according to the first embodiment, the adhesive means are received in the respective small-size recesses of the tape body, on which tape body electronic circuit elements are held in a manner to cover the adhesive means received in the respective recesses, so that dirt and/or dust will not stick directly to the adhesive means at all.

Figure 9A:
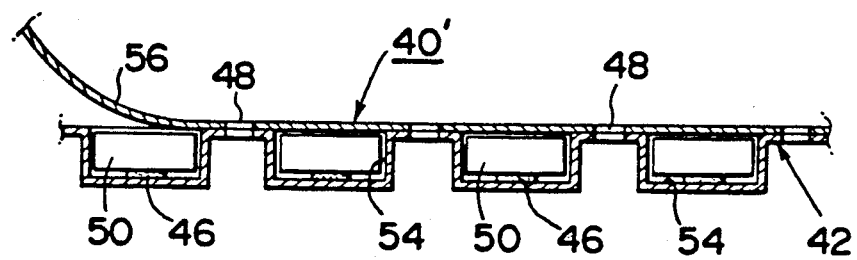
FIGS. 9A to 9C are vertical sectional views of modifications of the electronic circuit element series shown in FIG. 2.
Figure 9B:
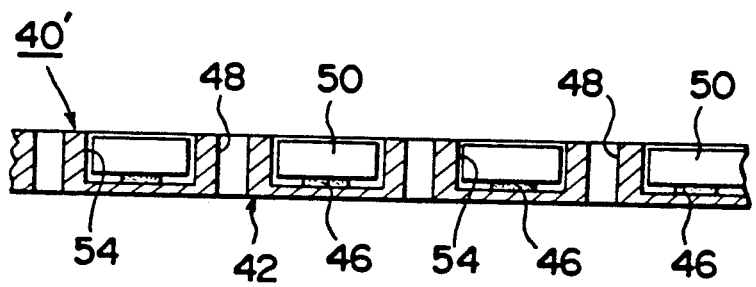
Figure 9C:
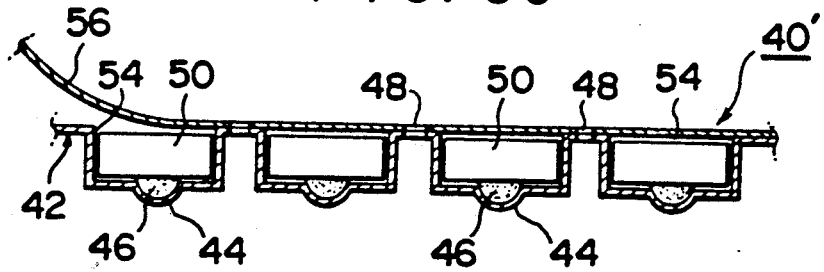

Referring to FIGS. 9A-9C, modifications of the first embodiment will be described. In a modification shown in FIG. 9A, the tape body 42 has a plurality of concaves 54 arranged at equal intervals in a row in the longitudinal direction of the tape body 42 to form hollows for receiving respective ones of surface-mounted electronic circuit elements 50 therein. The forming of the concaves 54 in the tape body 42 may be carried out by embossing portions of a tape body sheet. In a modification shown in FIG. 9B, a thick tape body sheet 42 is employed. By indenting portions of the thick tape body sheet 42, a plurality of concaves 54 for receiving respective ones of surface-mounted electronic circuit elements 50 therein are formed at equal intervals in the tape body sheet 42. In the modifications shown in FIGS. 9A and 9B, the adhesive means 46 is applied onto at least one point on an inner bottom surface of each of the concaves 54, through which adhesive means a surface-mounted electronic circuit element 50 received within each of the concaves 54 is held on the inner bottom surface of the concave 54. Further, in the modification shown in FIG. 9A, the electronic circuit element series 40' is covered with a cover tape 56 at an upper surface thereof. A modification shown in FIG. 9C is constructed in the same manner as the modification of FIG. 9A is done, but the modification of FIG. 9C further includes at least one relatively small-size recess 44 of a substantially hemispherical shape for receiving the adhesive means 46 therein and formed at the bottom surface of each of the concaves 54. Further, a surface-mounted electronic circuit element 50 is received in each of the concaves 54 to be held on the inner bottom surface of the concave 54 through the adhesive means 46 received in at least one small-size recess 44 of the concave 54. Furthermore, the modifications shown in FIGS. 9A to 9C have the feeding perforations 48 in the same manner as the electronic circuit element series 40' of FIG. 2.

Figure 10:
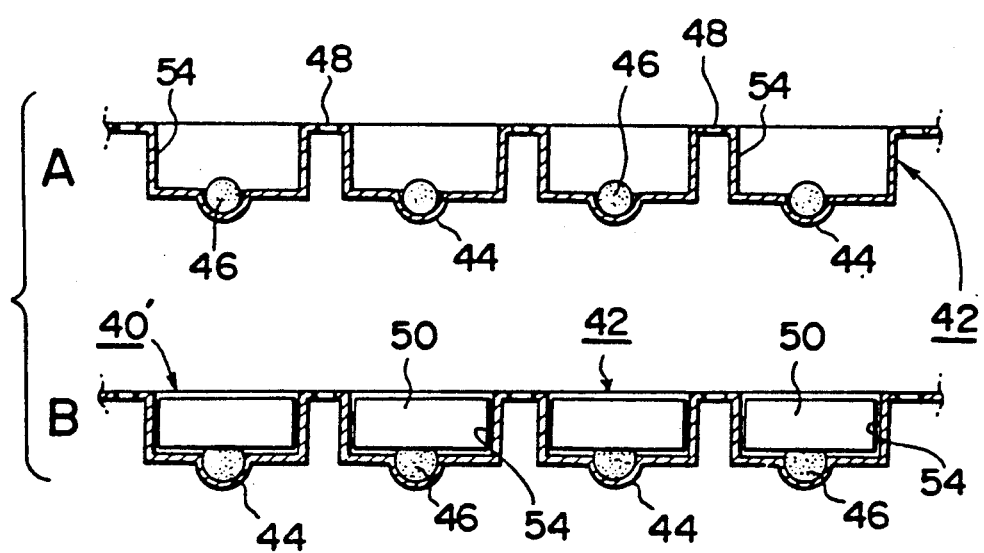
FIGS. 10A and 10B are segmentary vertical sectional views for explaining the manner of manufacturing the electronic circuit element series shown in FIG. 9C.

The modifications of FIGS. 9A to 9C are manufactured in the same manner as the electronic circuit element series 40' of FIG. 2 is done. For all that, in order to facilitate a better understanding of the manner of manufacturing of the modifications of FIG. 9, the manufacturing manner will be described briefly with reference to FIG. 10 showing typical steps of manufacturing the modification of FIG. 9C. First, the forming of the concaves 54 and recesses 44 is carried out by embossing portions of a tape body sheet 42, and adhesive means 46 which is softened by heating and therefore has exhibited adhesion is then filled into each of the recesses 44 as shown in FIG. 10A. Immediately thereafter, a surface-mounted electronic circuit element 50 is received in each of the concaves 54 so as to come into contact with the adhesive means 46 having exhibited adhesion, whereby the electronic circuit element 50 may be held on the inner bottom surface of the concave 54 through the adhesive means 46 as shown in FIG. 10B. Then, the tape body sheet 42 having the electronic circuit elements 50 held on the inner bottom surfaces of the respective concaves 54 is covered with cover tape 56 at its upper surface.

The electronic circuit element series 40' manufactured in the above described manner is generally spirally wound around a reel as explained in the description of the first embodiment. Also, removing or extracting of the electronic circuit elements 50 from the tape body of the electronic circuit element series 40' which is performed in order to mount the electronic circuit elements on printed circuit boards is carried out in the same manner as explained in the description of the first embodiment. For all that, in order to facilitate a better understanding of the manner of the removing of the electronic circuit elements from the tape body of the electronic circuit element series 40', the removing manner will be described briefly with reference to FIG. 11(A-D). First, the electronic circuit element series 40' is drawn out from a reel (not shown) to be delivered, during which the cover tape is peeled off from the tape body 42 by any suitable means. When one of the electronic circuit elements 50 having been held on the tape body 42 reaches a position right below a waiting position of the mounting head 300 as shown in FIG. 11A, the mounting head 300 is synchronously moved downwardly with respect to the tape body 42 to hold the electronic circuit element 50 by suction as shown in FIG. 11B. As soon as the mounting head 300 holds the electronic circuit element 50 by suction to be moved upwardly, the ejector pin 302 is synchronously moved upwardly to push up the electronic circuit element 50 together with the adhesive means 46 through the recess portion 44 of concave 54 on which the electronic circuit element is arranged in order to facilitate the extraction of the electronic circuit element 50 from the concave 54. At this time, the recess portion 44 is reversed by the pushing-up motion of the ejector pin 302 as shown in FIG. 11C, so that the adhesive means 46 is pushed up together with the electronic circuit element 50, resulting in the electronic circuit element 50 with the adhesive means 46 being extracted from the concaves 54 by the upward movement of the mounting head 300 as shown in FIG. 11D. Then, the adhesive means 46 sticking to the extracted electronic circuit element 50 is subjected to a heating treatment as explained in the description of the first embodiment. Immediately thereafter, the electronic circuit element 50 is placed on a printed circuit board by the mounting head, resulting in the electronic circuit element being provisionally fixed, through the adhesive means having exhibited adhesion due to heating, on the printed circuit board.

Thus, it will be noted that, in the modifications of the first embodiment, the electronic circuit elements are received within the respective concaves of the tape body, so that the electronic circuit elements are prevented from coming off from the tape body and being damaged by external force during handing of the electronic circuit element series.

Figure 12A:
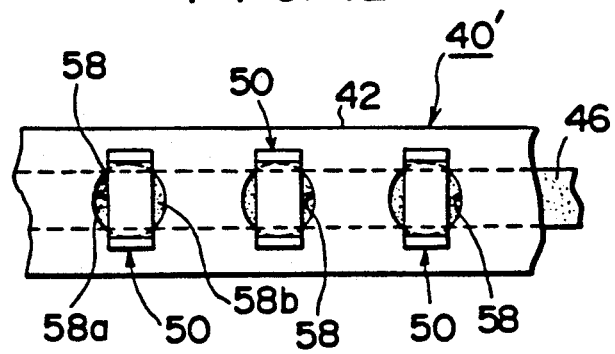
FIG. 12A is a segmentary plan view showing a carrier tape according to a second embodiment of this invention, wherein the carrier tape comprises a plurality of electronic circuit elements held on a tape body thereof to form an electronic circuit element series.
Figure 12B:
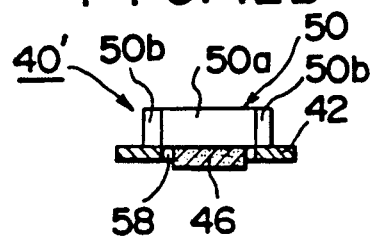
FIG. 12B is a vertical sectional view showing the electronic circuit element series shown in FIG. 12A.
Figure 12C:
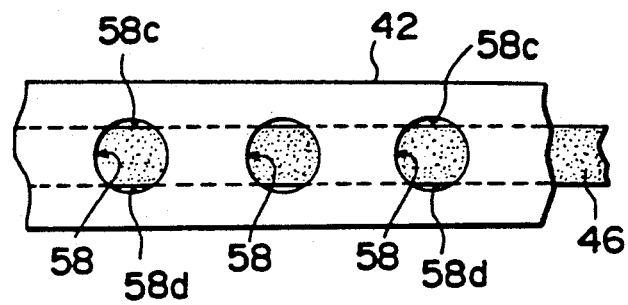
FIG. 12C is a segmentary plan view showing the electronic circuit element series shown in FIG. 12A, wherein the electronic circuit elements are removed from a tape body of the carrier tape for clarity of illustration.

Referring to FIGS. 12A-12C, a carrier tape constituting
an electronic circuit element series 40' according to a second embodiment of the present invention comprises a flexible tape body 42 which is made of a plastic material, extends in a longitudinal direction and is provided with a plurality of apertures 58 spaced at equal intervals from one another in a row in the longitudinal direction of the tape body 42; a plurality of electronic circuit elements 50 such as capacitors or special-type ICs, each of which is arranged on one surface or an upper surface of the tape body 42 in a manner to be laid across one of apertures 58 of the tape body 42; and adhesive means 46 for use in the provisional fixing of electronic circuit elements 50 on printed circuit boards. In the second embodiment, the adhesive means 46 is made in the form of a film which extends in a longitudinal direction. The adhesive film 46 is made of a material which exhibits adhesion upon being heated, and applied onto the other surface or a reverse surface of the tape body 42 in a manner such that the tape body 42 and adhesive film 46 are assembled in superposed relation.

In the second embodiment, each of the electronic circuit elements 50 comprises an element body 50a which is formed into a substantially rectangular shape, and two external terminals 50b which are integrally mounted on both shorter sides of the element body 50a. The electronic circuit elements 50 are arranged on the upper surface of the tape body 42 in a manner such that longer sides of the element bodies 50a intersect respective ones of the apertures 58 of the tape body 42 in the transverse direction of the tape body 42. In the embodiment being illustrated, each of the apertures 58 is formed into a substantially circular shape, but its shape is not limited to such a circular that, for example, the aperture 58 may be formed into a substantially rectangular shape as described later. Also, each of the apertures 58 has a diameter sufficient to permit its substantially both side portions 58a and 58b to respectively extend over in the longitudinal direction of the tape body 42 from the longer side edges of electronic circuit element body 50a when the electronic circuit element 50 is arranged on the upper surface of the tape body 42 in a manner to be laid across the aperture 58. More particularly, as shown in FIG. 12A, each of the electronic circuit element 50 is arranged on the tape body 42 in a manner to be laid across aperture 58 and permit the portions 58a and 58b of the aperture 58 to respectively extend over from left and right side edges of the element body 50a.

Also, as shown in FIG. 12C, the adhesive film 46 has a width slightly less than the diameter of each aperture 58 and is applied onto the reverse surface of the tape body 42 along the row of the apertures 58 in a manner such that transverse both side edges of the adhesive film 46 do not come into contact with regions 58c and 58d of the peripheral edge of each aperture 58, which are located in the transverse direction of the tape body 42. The adhesive film 46 may be formed of a polymeric material which exhibits adhesion upon being heated. For example, it may be formed of a polymeric material selected from the group consisting of silicone, acrylic resin and the mixture of silicone with acrylic resin which exhibits adhesion when it is heated to a temperature as low as about 80° C. The applying of the adhesive film 46 onto the tape body 42 is performed by heating the adhesive film 46 to cause it to exhibit adhesion and sticking it onto the reverse surface of the tape body 42 using so-exhibited adhesion. Immediately thereafter, supporting of electronic circuit elements 50 onto the upper surface of the tape body 42 is carried out using the adhesion of the adhesive film 46. More particularly, the supporting of the electronic circuit elements 50 to the tape body 42 is carried out by swelling, through the apertures 58, portions of the adhesive film 46 positionally corresponding to portions of the tape body 4 at which the apertures 58 are formed, and then attaching the element bodies 50a except the external terminals 50b onto the swelled portions of the adhesive film 46 which are exposed through the apertures 58 of the tape body 42 and have exhibited adhesion due to heating. Thus, the electronic circuit elements 50 are securely held on the tape body 42 through the swelled portions of the adhesive film 46 which have exhibited adhesion. Incidentally, the tape body 42 is provided with a plurality of feeding perforations (not shown) arranged along the longitudinal direction of the tape body 42.

Figure 13A:
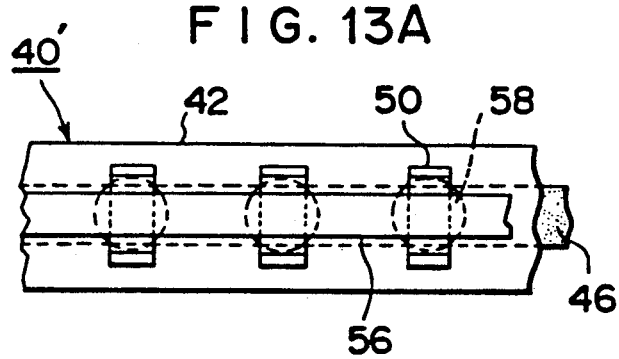
FIGS. 13A and 13B are, respectively, a segmentary plan view showing the electronic circuit element series of FIG. 12A which includes a cover tape, and a segmentary side elevation view of the electronic circuit element series shown in FIG. 13A.
Figure 13B:
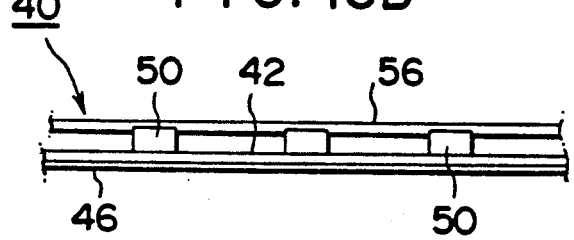

As explained in the description of the first embodiment, the electronic circuit element series 40' constructed as above is adapted to be spirally wound around a reel (not shown). The reel having the electronic circuit element series 40' spirally wound therearound, when it is used, is installed in an apparatus for automatically mounting electronic circuit elements on a printed circuit board. In order to protect the electronic circuit elements 50 held on the tape body 42 during the electronic circuit element series 40' being wound around the reel, the electronic circuit elements 50 may be covered with a cover tape 56 as shown in FIG. 13. As explained in the description of the first embodiment, delivering of the electronic circuit element series 40' is carried out by engagement of any suitable means with the unshown feeding perforations of the electronic circuit element series 40'. More particularly, by engaging the suitable means with the feeding perforations of the tape body 42, the electronic circuit element series 40' is drawn out from the reel to cause the electronic circuit elements 50 to be fed to a position right below a waiting position of an electronic circuit element mounting head of the mounting apparatus.

Figure 14:
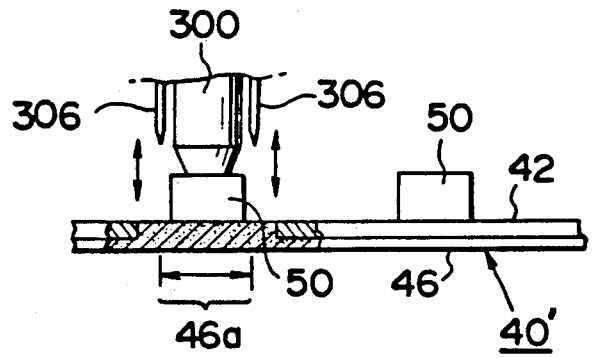
FIG. 14 schematically shows, with parts cut away, a side elevation view for explaining the manner of removing of an electronic circuit element from the tape body of the electronic circuit element series of FIGS. 12 and 13.
Figure 15:
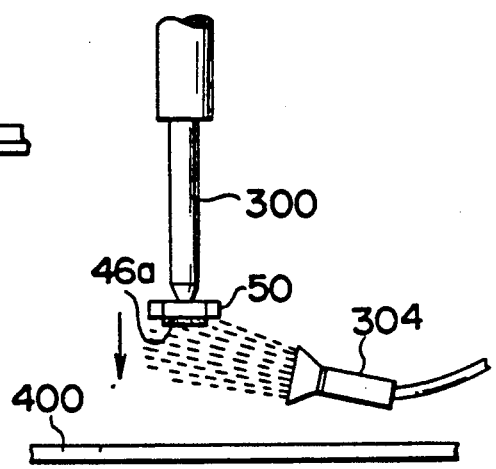
FIG. 15 is a schematic view for explaining the manner of heating of adhesive means sticking to the electronic circuit element which has been removed from the tape body of the electronic circuit element series of FIGS. 12 and 13.

As shown in FIG. 14, when one of the electronic circuit elements 50 held on the tape body 42 reaches a position right below a waiting position of a mounting head 300, the mounting head 300 is moved downwardly to hold the electronic circuit element 50 by vacuum. Simultaneously with the downward movement of the mounting head 300, cutter means 306 arranged near the both sides of the mounting head 300 are move downwardly with respect to the electronic circuit element series 40' to make cuts at portions of the adhesive film 46 which positionally correspond to the portions 58a and 58b of the aperture 58 which extend over from the longer side edges of the element body 50a of the electronic circuit element 50. More particularly, the cutter means 306 make cuts at portions of the adhesive film 46 along the edges of the longer sides of the element body 50a, resulting in a portion 46a of the adhesive film 46 which has stuck to a bottom surface of the element body 50a being separated from the remaining portion of the adhesive film 46. Then, the mounting head 300 having held the electronic circuit element 50 with the adhesive film portion 46a by vacuum is moved upwardly to remove the electronic circuit element 50 from the tape body 42 and is then moved to a position right above printed circuit board 400 (FIG. 15). The mounting head 300 is then moved downwardly with respect to the printed circuit board 400 to place the electronic circuit element 50 on the printed circuit board 400. Before the mounting head 300 is moved downwardly to place the electronic circuit element 50 on the printed circuit board 400, the adhesive film portion 46a sticking to the bottom surface of the electronic circuit element 50 is subjected to a heating treatment using hot air ejected from an injection nozzle 304, as shown in FIG. 15. The heating treatment may be carried out using, as the hot air, air heated to a temperature of about 80° C., resulting in the adhesive film portion 46a exhibiting adhesion. Then, the mounting head 300 having held the electronic circuit element 50 by vacuum is moved downwardly to place the electronic circuit element 50 into contact with the printed circuit board 400, resulting in the electronic circuit element 50 being provisionally fixed on the printed circuit board 400 through the adhesive film portion 46a having exhibited adhesion. In this connection, the provisional fixing of the electronic circuit element 50 on a printed circuit board may be carried out by preparing a printed circuit board having a hot-melt type solder or a cream solder previously applied to a conductive pattern which is formed on the printed circuit board and placing the electronic circuit element 50 on the printed circuit board in a manner such that the external terminals 50b of the electronic circuit element 50 come into contact with the solder.

The above-described procedure is substantially repeated to provisionally hold a predetermined number of electronic circuit elements on a printed circuit board to form a desired electronic circuit. Thereafter, the printed circuit board is passed through a heating oven, resulting in the electronic circuit elements being firmly fixed through the external terminals on the printed circuit board by soldering.

As can be seen from the foregoing, the electronic circuit element series according to the second embodiment of the present invention can facilitate removing of the electronic circuit elements from the tape body of the electronic circuit element series without any trouble.

Figure 16A:
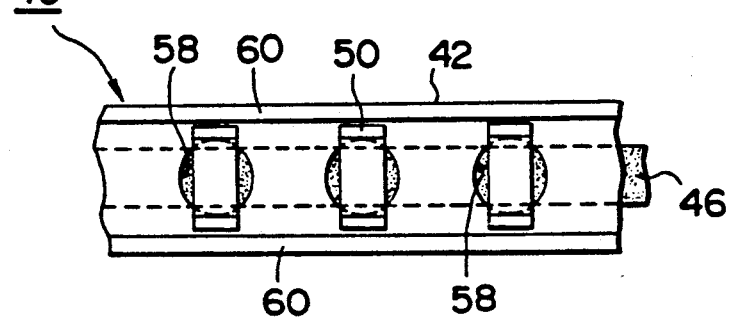
FIGS. 16A and 16B are, respectively, a segmentary plan view showing a modification of the electronic circuit element series shown in FIG. 12, and a vertical sectional view of the modification shown in FIG. 16A.
Figure 16B:
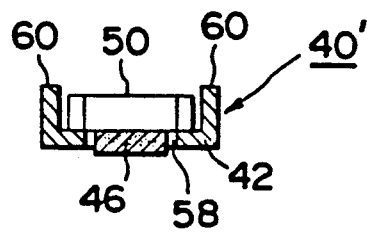

A modification of the second embodiment is shown in FIG. 16. In the modification of FIG. 16, parts which are identical to those shown in FIGS. 12 and 13 are identified by the same designators and the description of them will not be repeated.

Referring now to FIG. 16, the tape body 42 is provided with side walls 60, each of which extends along each side of the tape body 42 in the longitudinal direction of the tape body 42. The height of the side walls 60 is more than that of each of the electronic circuit elements 50 held on the tape body 42. Like the electronic circuit element series 40' of FIGS. 12 and 13, the electronic circuit element series 40' of FIG. 16 is provided with the unshown feeding perforation.

Figure 17:
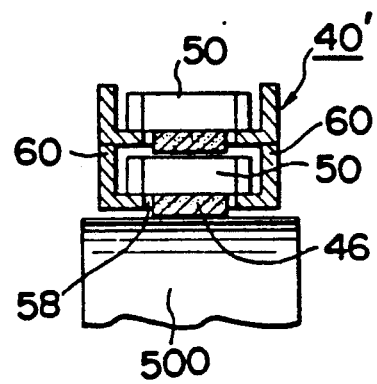
FIG. 17 is a vertical sectional view for explaining a state of the electronic circuit element series of FIG. 16 being wound around a reel.
Figure 18:
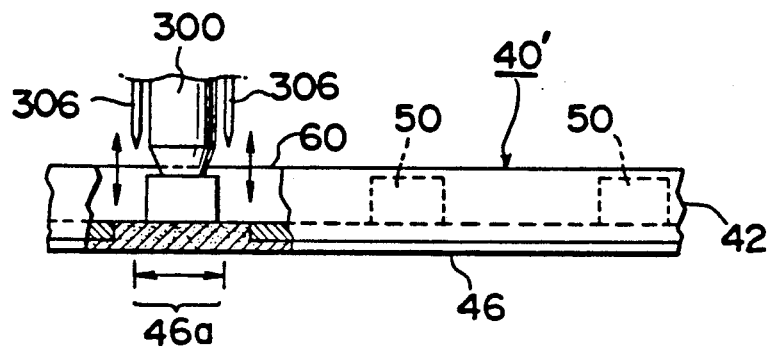
FIG. 18 is a schematic view for explaining the manner of removing of an electronic circuit element from the tape body of the electronic circuit element series of FIG. 16.

The electronic circuit element series 40' shown in FIG. 16 is spirally wound around a reel 500 as shown in FIG. 17. In the spirally wound electronic circuit element series 40', the reverse side of an outside wound portion of the electronic circuit element series 40' is in contact with top surfaces of the side walls 60 of an inside wound portion of the electronic circuit element series 40' as shown in FIG. 17, so that the electronic circuit elements 50 held on the inside wound portion are out of contact with the reverse side of the outside wound portion. Thus, the electronic circuit elements 50 held on the tape body 42 are protected through the side walls 60 of the tape body 42 from external force which may be accidentally applied to the wound electronic circuit element series. Since the removing of an electronic circuit element 50 from the tape body 42 and the provisional fixing of it on a printed circuit board are carried out in the same manner as explained in the description of the second embodiment, the description of them is not repeated. However, in order to facilitate a better understanding of the manner of removing of an electronic circuit element 50 from the tape body 42, the removing step is shown in FIG. 18.

Figure 19A:
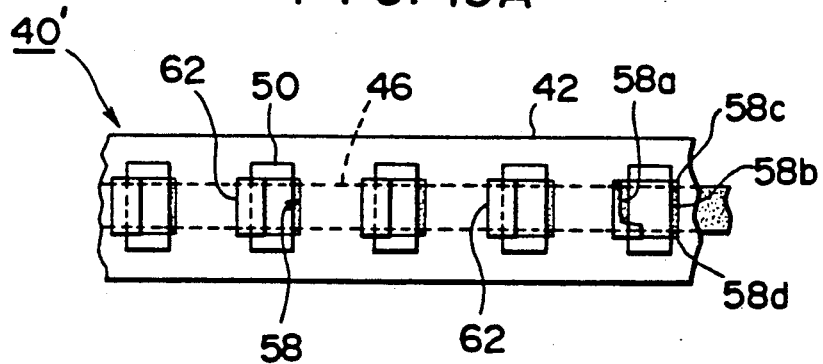
FIGS. 19A and 19B are a segmentary plan view showing another modification of the electronic circuit element series shown in FIG. 12, and a segmentary side elevation view showing the modification of FIG. 19A, respectively.
Figure 19B:
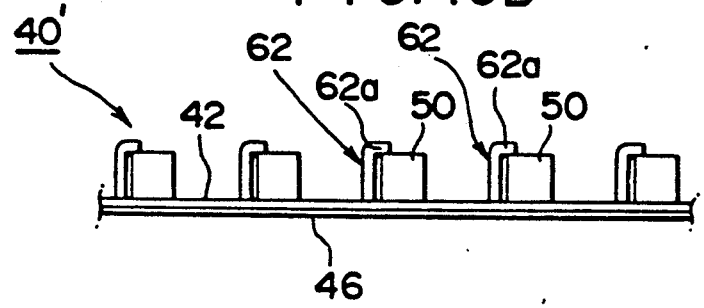

FIG. 19 shows another modification of the second embodiment. In this modification, the tape body 42 is provided with a plurality of tongue-like rising pieces 62 of substantially inverted L-shapes which are arranged at equal intervals along the longitudinal direction of the tape body 42. The rising pieces 62 are made by raising up at right angles to the tape body 42 respective ones of portions of the tape body 42 which are cut in order to form the respective apertures 58. Each of the rising pieces 62 is more in height than the electronic circuit elements 50 held on the tape body 42, and comprises a vertical portion and a horizontal portion 62a which lies generally parallel to the tape body 42. The horizontal portions 62a of the rising pieces 62 are respectively engaged with the upper surfaces of the electronic circuit elements 50, whereby the upper surface of each electronic circuit element 50 is partially covered with the horizontal portion 62a of the rising piece 62. In this modification, each of the apertures 58 is of a substantially rectangular shape and has a size sufficient to permit its both side portions 58a and 58b to extend over in the longitudinal direction of the tape body 42 from the longer side edges of an electronic circuit element body 50 when the electronic circuit element 50 is arranged on the upper surface of the tape body 42 in a manner to be laid across the aperture 58. Further, the adhesive film 46 has a width slightly less than a width of each aperture 58 (measured in the transverse direction of the tape body 42) and is applied onto the reverse surface of the tape body 42 along the row of the apertures 58 in a manner such that transverse both side edges of the adhesive film 46 do not come into contact with both side edges 58c and 58d of the respective apertures 58, which are located in the transverse direction of the tape body 42. In the electronic circuit element series 40' of FIG. 19, the remaining parts of the electronic circuit element series are constructed and arranged in substantially the same manner as those of FIGS. 12 and 13 are done.

Figure 20:
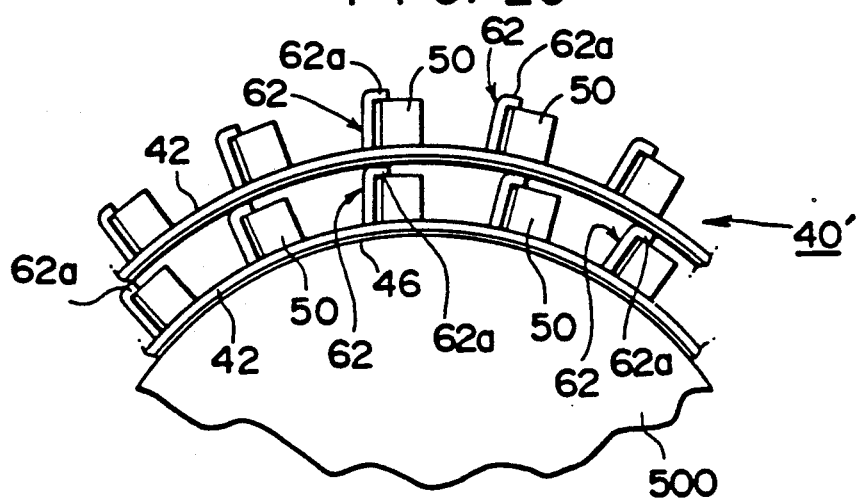
FIG. 20 is a segmentary side elevation view for explaining a state of the electronic circuit element series of FIG. 19 being wound around a reel.
Figure 21:
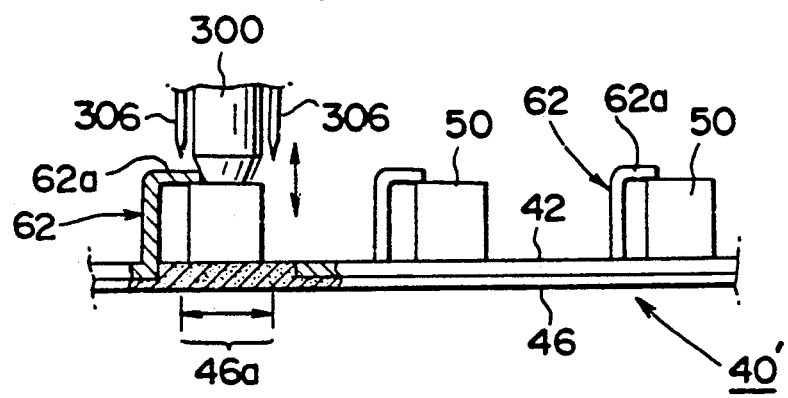
FIG. 21 schematically shows, with parts cut away, a side elevation view for explaining the manner of removing of an electronic circuit element from the tape body of the electronic circuit element series of FIG. 19.

The electronic circuit element series 40' of FIG. 19 is spirally wound around a reel 500 (FIG. 20) in the same manner as the electronic circuit element series of FIGS. 12 and 13 are done. As shown in FIG. 20, in the spirally wound electronic circuit element series 40', the horizontal portions 62a of the rising pieces 62 of an inside wound portion of the electronic circuit element series 40' are in contact with the reverse surface of an outside wound portion of the electronic circuit element series 40', so that the electronic circuits elements 50 held on the inside wound portion of the electronic circuit element series 40' do not come into direct contact with the reverse surface of the outside wound portion. Thus, the electronic circuit elements 50 held on the tape body 42 are protected by means of the rising pieces 62 from external force which may be accidentally applied to the electronic circuit element series. Incidentally, the removing of an electronic circuit element 50 from the tape body 42 done in order to fix it on a printed circuit body is carried out in generally the same manner as explained in the description of the second embodiment. More particularly, when the electronic circuit element mounting head 300 is moved downwardly with respect to the electronic circuit element series 40' of FIG. 19 in order to remove an electronic circuit element 50 from the tape body 42, the cutter means 306 are simultaneously moved downwardly as shown in FIG. 21 and then one of the cutter means 306 breaks through a horizontal portion 62a of a rising piece 62 to cut it off. Then, the removing of the electronic circuit element 50 from the tape body 42 is carried out in the same manner as stated in the description of the second embodiment. Since the provisional fixing of the removed electronic circuit element on a printed circuit board is performed in the same manner as explained in the description of the second embodiment, its description is not repeated.

Figure 22A:
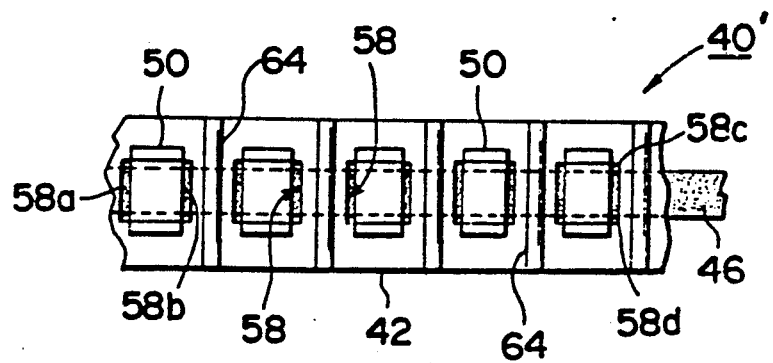

FIG. 22 shows still another modification of the second embodiment. In this modification, the tape body 42 is provided with a plurality of partition walls 64 for partitioning the electronic circuit elements 50 from one another, which are arranged at equal intervals along the longitudinal direction of the tape body 42. The partition walls 64 are formed along the longitudinal direction of the tape body 42 by folds in the tape body 42 at right angles to base portions 42a of the tape body 42 as shown in FIG. 22B. The apertures 58 are formed at respective ones of the base portions 42a of the tape body 42 which are divided by the partition walls 64. An electronic circuit element 50 is arranged on each of the base portions 42a of the tape body 42 in a manner to be laid across the aperture 58. The partition walls 64 are more in height than the electronic circuit elements 50 held on the tape body 42. The remaining parts of the electronic circuit element series of FIG. 22 are constructed in substantially the same manner as explained in the description of the second embodiment.

The electronic circuit element series 40' of FIG. 22 is spirally wound around a reel 500 (FIG. 23) in the same manner as the electronic circuit element series of FIG. 12 is done. In the spirally wound electronic circuit element series 40', the upper portions of the partition walls 64 of an inside wound portion of the electronic circuit element series 40' are in contact with the reverse surface of an outside wound portion of the electronic circuit element series 40' as shown in FIG. 23, so that the electronic circuit elements 50 held on the inside wound portion of the electronic circuit element series 40' do not come into direct contact with the reverse side of the outside wound portion of the electronic circuit elements 40'. Thus, the electronic circuit elements 50 held on the tape body 42 are protected by means of the partition walls 64 from external force which may be accidentally applied to the electronic circuit element series. Since the removing of an electronic circuit element 50 from the tape body 42 and the provisional fixing of it on a printed circuit board are carried out in the same manners as explained in the description of the second embodiment of FIG. 12, the description of them is not repeated. However, in order to facilitate a better understanding of the manner of removing an electronic circuit element 50 from the tape body 42, the removing step is shown in FIG. 24.

As can be seen from the description of the modifications shown in FIGS. 16, 19 and 22, the electronic circuit element series according to the modifications of the second embodiment can facilitate removing of the electronic circuit elements from the tape body without any trouble. In addition, it is possible to prevent the electronic circuit elements held on the tape body from being damaged by external force and coming off from the tape body during handling of the electronic circuit element series.

While preferred embodiments of the present invention have been described with a certain degree of particularity with reference to the drawings, obvious modifications and variations are possible in the light of the above teachings. It is therefore to be understood that within the scope of the appended claims, the invention may be practiced otherwise than as specifically described.

What is claimed is:

1. An electronic circuit element series comprising:
   a carrier tape including a continuous elongated flexible tape body;
   a plurality of electronic circuit elements arranged on an upper surface of said flexible tape body at equal intervals in a row in the direction of elongation of said tape body and adapted to be provisionally held on printed circuit boards prior to a final fixing of the circuit elements on the printed circuit boards by soldering;
   said tape body having at least one recess formed at each of portions of said tape body on which the plurality of the electronic circuit elements are arranged, said at least one recess at each of said portions being open toward the upper surface of said tape body and curved in a downward direction from said tape body; and
   adhesive means contained in each of said recesses of said tape body for temporary fixing said electronic circuit elements on said printed circuit boards, said adhesive means being formed of a material having the property of exhibiting adhesion upon being heated;
   said electronic circuit elements being held on said tape body by said adhesive means contained in said recesses.

2. An electronic circuit element series as defined in claim 1, wherein each of said recesses of said tape body is of a hemispherical shape.

3. An electronic circuit element series as defined in claim 1, wherein each of said adhesive means is formed of a polymeric material selected from the group consisting of silicone, acrylic resin, and the mixture of silicone with acrylic resin.

4. An electronic circuit element series as defined in claim 1, wherein said body is made of a soft resin material.

5. An electronic circuit element series as defined in claim 1, wherein each of said recess of said tape body is of a hemispherical shape, and wherein each of said adhesive means is formed of a polymeric material selected from the group consisting of silicone, acrylic resin, and the mixture of silicone with acrylic resin.

6. An electronic circuit element series as defined in claim 5, wherein said tape body is made of resin material.

7. An electronic circuit element series as defined in claim 1, wherein said tape body has a plurality of concavities spaced from each other at equal intervals along the direction of elongation of said body, to form hollows each for receiving an electronic circuit element therein, wherein said at least one recess is formed at a bottom of each said concavities such that it is curved in a downward direction from the bottom of each of said concavities, and wherein each of said electronic circuit elements is received in one of said concavities and held on the bottom surface of said concavity by said adhesive means contained in the recess of said concavity.

8. An electronic circuit element series as defined in claim 7, wherein each of said recesses of said tape body is of a hemispherical shape.

9. An electronic circuit element series as defined in claim 7, wherein each of said adhesive means is formed of a polymeric material selected from the group consisting of silicone, acrylic resin, and the mixture of silicone with acrylic resin.

10. An electronic circuit element series as defined in claim 7, wherein said tape body is made of resin material.

11. An electronic circuit element series as defined in claim 7, wherein each of said recesses of said tape body is of a hemispherical shape, and wherein each of said adhesive means is formed of a polymeric material selected from the group consisting of silicone, acrylic resin, and the mixture of silicone with acrylic resin.

12. An electronic circuit element series as defined in claim 11, wherein said tape body is made of resin material.

13. An electronic circuit element series as defined in claim 7, further including a cover tape applied onto an upper surface of said tape body to cover said concavities of said tape body.

14. An electronic circuit element series as defined in claim 8, further including a cover tape applied onto an upper surface of said tape body to cover said concavities of said tape body.

15. An electronic circuit element series as defined in claim 9, further including a cover tape provided on an upper surface of said tape body to cover said concavities of said tape body.

16. An electronic circuit element series as defined in claim 10, further including a cover tape applied onto an upper surface of said tape body to cover said concavities of said tape body.

17. An electronic circuit element series as defined in claim 11, further including a cover tape provided on an upper surface of said tape body to cover said concavities of said tape body.

18. An electronic circuit element series as defined in claim 12, further including a cover tape applied onto an upper surface of said tape body to cover said concavities of said tape body.

19. An electronic circuit element series as defined in claim 8, wherein each concavity is of a rectangular cross-section.

20. An electronic circuit element series as defined in claim 1, wherein each of said recesses is at said upper surface of said tape body of a size smaller than a bottom surface area of each electronic circuit element held on said tape body by said adhesive means contained in each of said recesses.

21. An electronic circuit element series comprising:
- a carrier tape including a continuous elongated flexible tape body;
- a plurality of electronic circuit elements arranged on an upper surface of said flexible tape body at equal intervals in a row in the direction of elongation of said tape body and adapted to be provisionally held on printed circuit boards prior to a final fixing of the circuit elements on the printed circuit boards by soldering;
- said tape body having at least one recess formed at each of portions of said tape body on which the plurality of the electronic circuit elements are arranged, said at least one recess at each of said portions being open at the upper surface of said tape body and curved in a downward direction from said tape body; and
- adhesive means contained in each of said recesses of said tape body and filling each of said recesses for temporary fixing said electronic circuit elements on said printed circuit boards, said adhesive means being formed of a material having the property of exhibiting adhesion upon being heated;
- said electronic circuit elements being held on said tape body by said adhesive means contained in said recesses;
- each of said recesses being at said upper surface of said tape body of a size smaller than a bottom surface area of each electronic circuit element held on said tape body by said adhesive means contained in each of said recesses.

22. An electronic circuit element series as defined in claim 21, wherein each of said recesses of said tape body is of hemispherical shape.

23. An electronic circuit element series as defined in claim 21, wherein each of said adhesive means is formed of a polymeric material selected from the group consisting of silicone, acrylic resin, and the mixture of silicone with acrylic resin.

24. An electronic circuit element series as defined in claim 21, wherein said tape body is made of resin material.

25. An electronic circuit element series as defined in claim 21, wherein said tape body has a plurality of concavities spaced from each other at equal intervals along the direction of elongation of said body, to form hollows each for receiving an electronic circuit element therein, wherein said at least one recess is formed at a bottom of each of said concavities such that it is curved in a downward direction from the bottom of each of said concavities, and wherein each of said electronic circuit elements is received in one of said concavities and held on the bottom surface of said concavity by said adhesive means contained in the recess of said concavity.

* * * * *